(12) United States Patent
Fujiwara et al.

(10) Patent No.: US 10,649,013 B2
(45) Date of Patent: May 12, 2020

(54) FREQUENCY CONVERTER, MEASURING SYSTEM, AND MEASURING METHOD

(71) Applicant: Tokyo Metropolitan Industrial Technology Research Institute, Tokyo (JP)

(72) Inventors: Kohei Fujiwara, Tokyo (JP); Takeshi Kobayashi, Tokyo (JP)

(73) Assignee: Tokyo Metropolitan Industrial Technology Research Institute, Tokyo (JP)

( * ) Notice: Subject to any disclaimer, the term of this patent is extended or adjusted under 35 U.S.C. 154(b) by 118 days.

(21) Appl. No.: 15/553,365

(22) PCT Filed: Feb. 26, 2016

(86) PCT No.: PCT/JP2016/055825
§ 371 (c)(1),
(2) Date: Aug. 24, 2017

(87) PCT Pub. No.: WO2016/136947
PCT Pub. Date: Sep. 1, 2016

(65) Prior Publication Data
US 2018/0246151 A1   Aug. 30, 2018

(30) Foreign Application Priority Data

Feb. 27, 2015   (JP) .................. 2015-039192

(51) Int. Cl.
*G01R 23/14*   (2006.01)
*H03D 7/00*   (2006.01)
(Continued)

(52) U.S. Cl.
CPC .............. *G01R 23/14* (2013.01); *G01R 27/28* (2013.01); *G01R 27/32* (2013.01); *H03D 7/00* (2013.01)

(58) Field of Classification Search
CPC ........ G01R 23/14; G01R 27/28; G01R 27/32; H03D 7/00
(Continued)

(56) References Cited

U.S. PATENT DOCUMENTS 4,451,782 A * 5/1984 Ashida .................. G01R 27/28
324/76.26
4,703,433 A   10/1987 Sharrit
(Continued)

FOREIGN PATENT DOCUMENTS

CN   1468377 A   1/2004
CN   1725653 A   1/2006
(Continued)

OTHER PUBLICATIONS

Rohde & Schwarz. Millimeter-wave measurements using Converters of the R&S ZVA Family. Sep. 2007. (Year: 2007).*
(Continued)

*Primary Examiner* — Patrick Assouad
*Assistant Examiner* — Sean Curtis
(74) *Attorney, Agent, or Firm* — TraskBritt

(57) ABSTRACT

A frequency converter receives a predetermined input signal and a predetermined local oscillation signal, and outputs a signal obtained by mixing the input signal with a harmonic signal having a frequency n times the frequency of the local oscillation signal, wherein a circuit that mixes the input signal with the harmonic signal is a harmonic mixer, which mixes the harmonic signal with the input signal using a nonlinear characteristic of a semiconductor element, and wherein the input signal or the output signal is subjected, either before input to the frequency converter or after output from the frequency converter, to correction on the basis of
(Continued)

the amplitude and phase frequency characteristics of the frequency converter, which have been determined in advance.

8 Claims, 9 Drawing Sheets

(51) Int. Cl.
*G01R 27/32* (2006.01)
*G01R 27/28* (2006.01)

(58) Field of Classification Search
USPC .......... 324/6.11, 76.12, 76.19, 76.23, 76.39, 324/76.41, 76.43, 76.77, 85
See application file for complete search history.

(56) References Cited

U.S. PATENT DOCUMENTS

| | | | | |
|---|---|---|---|---|
| 5,184,093 | A * | 2/1993 | Itoh | H03L 7/18 327/107 |
| 6,065,137 | A * | 5/2000 | Dunsmore | G01R 27/28 356/73.1 |
| 6,348,804 | B1 * | 2/2002 | Evers | G01R 27/28 324/646 |
| 6,639,393 | B2 * | 10/2003 | Tasker | G01R 27/28 324/606 |
| 6,861,833 | B2 * | 3/2005 | Miyauchi | G01R 23/173 324/76.19 |
| 6,901,248 | B1 * | 5/2005 | Cowley | H03D 7/18 348/731 |
| 6,970,000 | B2 * | 11/2005 | Evers | G01R 23/14 324/638 |
| 7,061,222 | B2 * | 6/2006 | Shank | G01R 27/32 324/520 |
| 7,231,311 | B2 * | 6/2007 | Verspecht | G01R 23/20 702/109 |
| 7,772,827 | B2 * | 8/2010 | Evers | G01R 27/32 324/76.74 |
| 7,826,816 | B2 * | 11/2010 | Zhuo | H03D 7/166 455/315 |
| 8,022,687 | B2 * | 9/2011 | Ortler | G01R 35/005 324/638 |
| 8,270,535 | B2 * | 9/2012 | Iizuka | H03D 7/18 375/316 |
| 8,456,175 | B2 * | 6/2013 | Marchetti | G01R 31/2822 324/615 |
| 8,937,572 | B2 * | 1/2015 | Kobayashi | G01S 13/343 331/25 |
| 9,036,390 | B2 * | 5/2015 | Kitsunezuka | H02M 5/02 363/157 |
| 9,091,724 | B2 * | 7/2015 | Ortler | H03L 7/23 |
| 9,094,103 | B2 * | 7/2015 | Morrison | H04B 1/525 |
| 9,214,718 | B2 * | 12/2015 | Mow | H01Q 1/243 |
| 9,484,861 | B1 * | 11/2016 | Hammi | H03F 3/19 |
| 9,906,152 | B2 * | 2/2018 | Li | H03D 7/165 |
| 10,042,029 | B2 * | 8/2018 | Dunsmore | G01R 35/005 |
| 2004/0041554 | A1 | 4/2004 | Miyauchi | |
| 2004/0219884 | A1 | 11/2004 | Mo et al. | |
| 2005/0088166 | A1 * | 4/2005 | Shank | G01R 27/32 324/85 |
| 2005/0221772 | A1 * | 10/2005 | Nakano | H03D 7/02 455/114.1 |
| 2006/0235638 | A1 * | 10/2006 | Verspecht | G01R 23/20 702/118 |
| 2007/0182424 | A1 * | 8/2007 | Benedikt | G01R 27/32 324/637 |
| 2007/0194776 | A1 * | 8/2007 | Bossche | G01R 27/28 324/76.22 |
| 2008/0014896 | A1 * | 1/2008 | Zhuo | H03D 7/166 455/326 |
| 2010/0141239 | A1 * | 6/2010 | Ortler | G01R 27/28 324/76.39 |
| 2010/0177850 | A1 * | 7/2010 | Iizuka | H03D 7/18 375/316 |
| 2010/0297966 | A1 | 11/2010 | Row et al. | |
| 2011/0025296 | A1 * | 2/2011 | Benedikt | G01R 31/2837 324/76.19 |
| 2012/0007605 | A1 * | 1/2012 | Benedikt | G01R 27/32 324/612 |
| 2012/0082251 | A1 | 4/2012 | Bossche | |
| 2012/0105049 | A1 * | 5/2012 | Ortler | H03L 7/23 324/76.39 |
| 2012/0161749 | A1 * | 6/2012 | Sternberg | H04B 17/21 324/76.23 |
| 2012/0161784 | A1 * | 6/2012 | Benedikt | G01R 31/2822 324/612 |
| 2013/0094270 | A1 * | 4/2013 | Kitsunezuka | H02M 5/02 363/157 |
| 2014/0126669 | A1 | 5/2014 | Mahoney et al. | |
| 2014/0306719 | A1 * | 10/2014 | Dunsmore | G01R 35/005 324/601 |
| 2015/0177300 | A1 * | 6/2015 | Paech | G01R 27/32 702/66 |
| 2016/0164426 | A1 * | 6/2016 | Li | H02M 5/02 363/157 |
| 2018/0246151 | A1 * | 8/2018 | Fujiwara | G01R 23/14 |

FOREIGN PATENT DOCUMENTS

| | | | | |
|---|---|---|---|---|
| CN | 102017398 | A | | 4/2011 |
| CN | 103595404 | A | | 2/2014 |
| EP | 1085652 | A2 * | 3/2001 | ............... H03D 7/18 |
| EP | 1258080 | B1 | | 11/2002 |
| EP | 1605585 | A1 | | 12/2005 |
| GB | 2516410 | A | | 1/2015 |
| JP | 05121949 | A * | 5/1993 | |
| JP | 11127476 | A | | 5/1999 |
| JP | 2000028711 | A | | 1/2000 |
| JP | 2002340950 | A | | 11/2002 |
| JP | 2003344464 | A | | 12/2003 |
| JP | 2005295097 | A | | 10/2005 |
| JP | 2005295097 | A * | 10/2005 | ............... H03D 7/02 |
| JP | 2007150935 | A | | 6/2007 |
| JP | 2012063336 | A | | 3/2012 |
| WO | 0229426 | A1 | | 4/2002 |
| WO | 2016136947 | A1 | | 9/2016 |
| WO | WO-2016136947 | A1 * | 9/2016 | ............. G01R 27/28 |

OTHER PUBLICATIONS

Yonghong Zhang et al: "Frequency Sources in W-band Radar Front-end with Low Phase Noise", International Journal of Infrared and Millimeter Waves, Kluwer Academic Publishers-Plenum Publishers, NE, vol. 29, No. 2, Dec. 4, 2007, pp. 142-147.

Michael Hiebel: "Millimeter-Wave Measurements Using Converters of the R&S ZVA Family", Sep. 1, 2007, Retrieved from the Internet: URL:https://cdn.rohde-schwarz.com/pws/dl_downloads/dl_application/application_notes/1ez55/1EZ55_0E.pdf.

Keysight Technologies: "Keysight Technologies Mixer Transmission Measurements Using the Frequency Converter Application in the PNA Microwave Network Analyzers Application Note Introduction", Jul. 31, 2014, Retrieved from the Internet: URL:http://literature.cdn.keysight.com/litweb/pdf/5988-8642EN.pdf.

Hugh J E Gibson et al: "Harmonic Mixers for VNA extenders to 900GHz", Mar. 23, 2010, pp. 173-176, Retrieved from the Internet: URL:https://www.researchgate.net/profile/Byron_Alderman/publication/228574681_Harmonic_mixers_for_VNA_extenders_to_900GHz/links/53f303420cf2bc0c40ecdb45/Harmonic-mixers-for-VNA-extenders-to-900GHz.pdf.

European Communication and Supplementary European Search Report for EP Application 16755691 dated Dec. 10, 2018.

Yoneo Akita et al., "An investigation of frequency characteristic correction at 60GHz band for milli wave communication devices", IEICE Technical Report, SRW2012-32, Dec. 2012.

PCT International Search Report and Written Opinion, PCT/JP2016/055825, dated May 10, 2016.

(56) References Cited

OTHER PUBLICATIONS

PCT International Search Report, PCT/JP2016/055825, dated May 10, 2016.
Yuelin Ma, et al., "Nonlinear Compensation by Predistorter using Feedback Signal with Limited Bandwidth", IEICE Technical Report, RCS2012-352, Mar. 2013.
Yuelin Ma, et al., "An Algorithm for Obtaining the Inverse for a Given Polynomial in Baseband," IEICE Trans. Fundamentals, vol. E96-A, No. 3 Mar. 2013.
Japanese Notice of Reasons for Refusal for Japanese Application No. 2015-039192, dated Dec. 26, 2018, 6 pages with English Translation.
Chinese First Office Action and Search Report for Chinese Application No. 201680011804.9, dated Mar. 18, 2020, 10 pages (Translation of Search Report Only).

\* cited by examiner

CONSTELLATION WHEN NO CORRECTION IS PERFORMED

EVM = 23.9%

CONSTELLATION WHEN VECTOR CORRECTION IS PERFORMED

EVM = 8.1%

FREQUENCY CONVERTER, MEASURING SYSTEM, AND MEASURING METHOD

CROSS-REFERENCE TO RELATED APPLICATIONS

This application is a national phase entry under 35 U.S.C. § 371 of International Patent Application PCT/JP2016/055825, filed Feb. 26, 2016, designating the United States of America and published as International Patent Publication WO 2016/136947 A1 on Sep. 1, 2016, which claims the benefit under Article 8 of the Patent Cooperation Treaty to Japanese Patent Application Serial No. 2015-39192, filed Feb. 27, 2015, the disclosure of each of which is hereby incorporated herein in its entirety by this reference.

TECHNICAL FIELD

This application relates to a frequency converter, a measuring system, and a measuring method.

BACKGROUND

In IEEE 802.11ad currently studied as an international standard for increasing the speed of a wireless local area network (LAN), a carrier frequency is about 60 GHz and radio waves of millimeter waves are expected to be used. Here, radio waves (electromagnetic waves) of frequencies of 30 to 300 GHz are called millimeter waves, radio waves of frequencies of 3 GHz to 30 GHz are called centimeter waves, and both are included in micro-waves indicating radio waves of frequencies of 300 MHz to 3 THz.

Furthermore, in IEEE 802.11ad, a modulation band is 2.16 GHz per channel, which is expected to be about 10 to 100 times the conventional band. To develop devices suitable for such standards, evaluation of characteristics of devices is performed through the following technique. That is, a measuring device corresponding to a conventional frequency band (e.g., a centimeter-wave band) and frequency converters are combined to evaluate characteristics of devices. Here, the frequency converters are apparatuses that down-convert a millimeter-wave signal to centimeter waves or up-convert a centimeter-wave signal to millimeter waves, for example.

CITATION LIST

Patent Literature

Patent Document 1: Japanese Unexamined Patent Application, First Publication No. 2012-063336.
Patent Document 2: Japanese Unexamined Patent Application, First Publication No. 2000-028711.
Patent Document 3: Japanese Unexamined Patent Application, First Publication No. H11-127476.

Non Patent Literature

Non Patent Document 1: Yuelin M A, Yasushi YAMAO, Yshihiko AKAIWA, "Nonlinear Compensation by Predistorter using Feedback Signal with Limited Bandwidth," The Institute of Electronics, Information and Communication engineers (IEICE), 2013-03.
Non Patent Document 2: Yuelin M A, Yasushi YAMAO, Yshihiko AKAIWA, "An algorithm for obtaining the inverse for a given polynomial in baseband," Ieice TRANS. FUNDAMENTALS, Vol. E96-A, No. 3, March 2013.
Non Patent Document 3: Yoneo AKITA, Hiroshi HANYU, Nobuhiko SHIBAGAKI, "An investigation of frequency characteristic correction at 60 GHz band for milli wave communication devices," Institute of Electronics, Information and Communication Engineers.

BRIEF SUMMARY

Technical Problem

In evaluation of a device corresponding to millimeter waves as described above, the following problems occur when a frequency converter is used. That is, a frequency converter that inputs or outputs a modulation signal such that the band for the above-mentioned one channel becomes 2.16 GHz is considerably expensive. In addition, the setup for measurement is complicated, device connection errors easily occur, and adjustment takes a long time. A configuration of a mixer included in the frequency converter is considered as one cause of such problems.

FIG. 7 shows an example of a configuration of a mixer included in a frequency converter used at millimeter waves. In general, it is difficult to manufacture a frequency converter that has a flat frequency characteristic and handles ultra-wideband modulation signals in millimeter waves. In addition, it is difficult to directly generate a millimeter-wave signal from centimeter waves and to directly convert millimeter waves to a centimeter-wave signal while maintaining a flat frequency characteristic. Accordingly, a double super-heterodyne frequency converter 200 as shown in FIG. 7 is generally employed. The frequency converter 200 shown in FIG. 7 includes two mixers 201 and 202 that receive two different frequencies $f_{LO1}$ and $f_{LO2}$ as local oscillation signals. In a case where the frequency converter 200 is used as an up-converter, a modulation signal having a frequency $f_{IF1}$ is input to the mixer 201 and converted into a signal having an intermediate frequency $f_{IF2}$ corresponding to the value of the sum of the frequency $f_{IF1}$ and the frequency $f_{LO1}$. Further, a signal having the frequency $f_{IF2}$ is input to the mixer 202 and converted into a radio-frequency signal having a frequency $f_{RF}$ corresponding to the value of the sum of the frequency $f_{IF2}$ and the frequency $f_{LO2}$. On the other hand, in a case where the frequency converter 200 is used as a down-converter, a radio-frequency signal having a frequency $f_{RF}$ is input to the mixer 202 and converted into a signal having an intermediate frequency $f_{IF2}$ corresponding to the difference value between the frequency $f_{RF}$ and the frequency $f_{LO2}$. In addition, a signal having a frequency $f_{IF2}$ is input to the mixer 201 and converted into a modulation signal having a frequency $f_{IF1}$ corresponding to the value of the difference between the frequency $f_{IF2}$ and the frequency $f_{LO1}$.

The double super-heterodyne frequency converter 200 shown in FIG. 7 includes two mixers. Accordingly, it is required that the frequency converter 200 have two types of local oscillation signals. Furthermore, interconnection between the mixers is required. Such configuration may cause an increase in costs, a complicated measurement setup, an increase in a likelihood of device connection error, and longer adjustment time.

Accordingly, there is a demand for a frequency converter having a simplified configuration, a measuring system, and a measuring method.

Solution to Problem

This disclosure can provide a frequency converter, a measuring system, and a measuring method.

DETAILED DESCRIPTION

Figure 1:
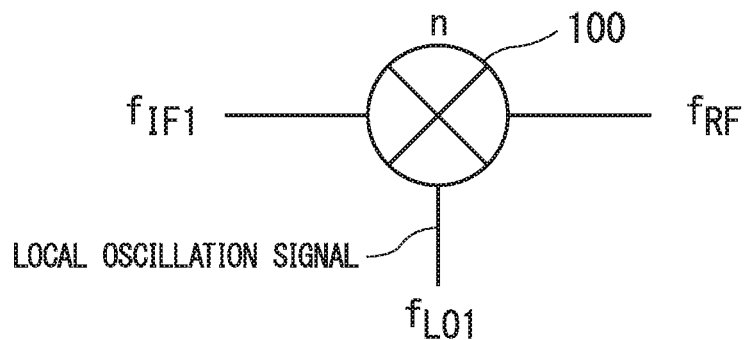
FIG. 1 is a diagram showing a basic configuration of a harmonic mixer included in a frequency converter of an embodiment of this disclosure.

Embodiments of this disclosure will be described below with reference to the drawings. First, a basic configuration of a harmonic mixer included in a frequency converter will be described with reference to FIG. 1 as an embodiment of this disclosure. FIG. 1 is a diagram showing a configuration example of a harmonic mixer 100 included in a frequency converter as an embodiment of this disclosure. Further, an embodiment of this disclosure relates to a harmonic mixer serving as a frequency converter having a flat frequency characteristic for measurement of modulation signals of an ultra-wideband corresponding to millimeter waves, for example, signals of frequency bands corresponding to the IEEE 802.11ad standard. Furthermore, the present embodiment relates to a measuring system capable of easily measuring modulation signals of an ultra-wideband corresponding to millimeter waves using a general-purpose digital oscilloscope by using the harmonic mixer so as to be in compliant with the IEEE 802.11ad standard.

The harmonic mixer 100 shown in FIG. 1 is a mixer including a circuit therein, which distorts an input local oscillation signal to generate harmonics thereof. The harmonic mixer 100 receives a local oscillation signal having a frequency $f_{LO1}$, distorts the local oscillation signal therein to generate harmonics having frequencies $n \times f_{LO1}$, which are n times the frequency of the local oscillation signal, and mixes the harmonics having the frequencies $n \times f_{LO1}$ with an input signal having a frequency $f_{RF}$ (in the case of a down-converter) or an input signal having a frequency $f_{IF1}$ (in the case of an up-converter).

Figure 7:
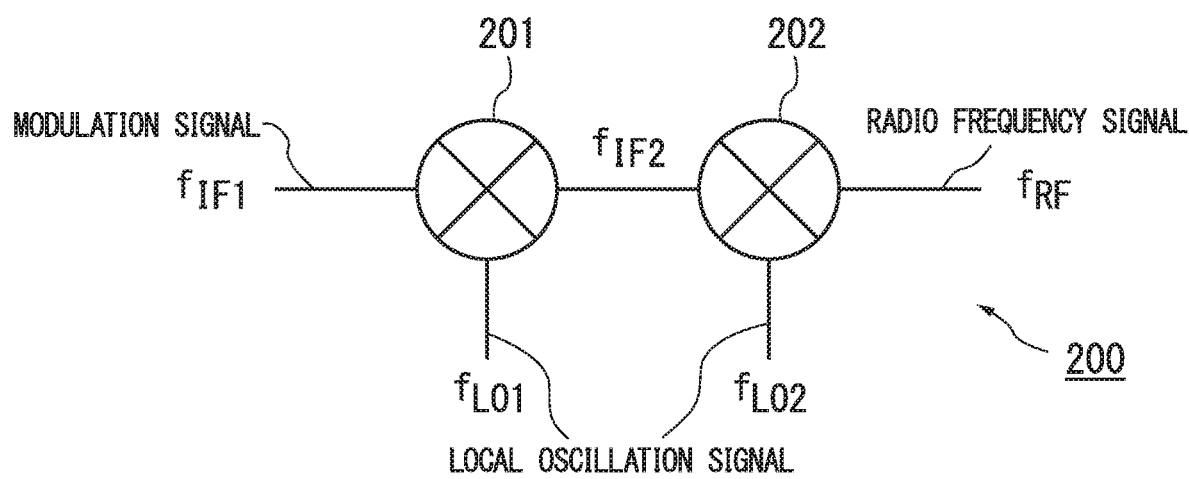
FIG. 7 is a diagram showing a background art of this disclosure.

In a case where the harmonic mixer 100 is used as a down-converter, a local oscillation signal is appropriately selected to obtain an output signal having an appropriate intermediate frequency $f_{IF1}$, in which harmonics $n \times f_{LO1}$ of a certain local oscillation signal $f_{LO1}$ have been mixed with an input frequency $f_{RF}$. This relationship is represented by the following equation, where n is an integer equal to or greater than 2, which is called a harmonic number, and indicates a harmonic order. Meanwhile, in the conventional mixer as described above with reference to FIG. 7, n=1 is satisfied because frequency conversion is performed without using harmonics.

$$f_{IF1} = f_{RF} - n \times f_{LO1}$$

On the other hand, in a case where the harmonic mixer 100 is used as an up-converter, a local oscillation signal is appropriately selected to obtain an output signal having an appropriate output frequency $f_{RF}$, in which harmonics $n \times f_{LO1}$ of a certain local oscillation signal have been mixed with an input frequency $f_{IF1}$. This relationship is represented by the following equation.

$$f_{RF} = f_{IF1} + n \times f_{LO1}$$

Figure 2:
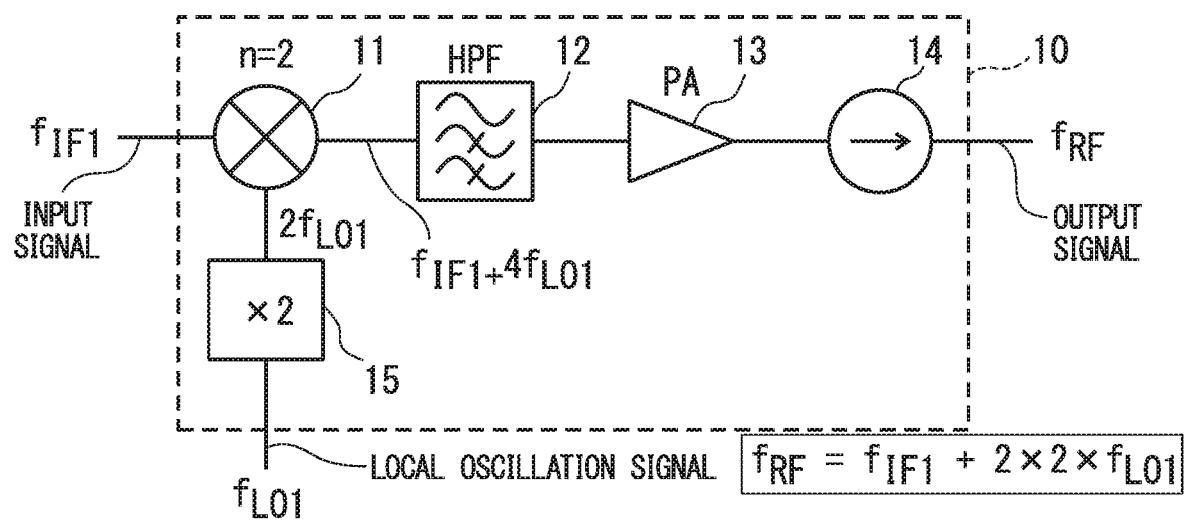
FIG. 2 is a block diagram showing a configuration example of a frequency converter 10 as an embodiment of this disclosure.

Next, a configuration example of a frequency converter 10 will be described with reference to FIG. 2 as an embodiment of this disclosure. The frequency converter 10 shown in FIG. 2 is configured as an up-converter. The frequency converter 10 shown in FIG. 2 includes a harmonic mixer 11, a high pass filter 12, a power amplifier (PA) 13, an isolator 14, and a multiplier 15.

The multiplier 15 has a multiplication number of k=2, for example, receives a local oscillation signal having a frequency $f_{LO1}$, and doubles the frequency (i.e., multiplies the frequency by k) to generate a radio-frequency signal having a frequency $2 \times f_{LO1}$ (i.e., $k \times f_{LO1}$) and outputs the radio-frequency signal as an output signal. In order to double the frequency $f_{LO1}$ of the local oscillation signal, for example, in the present embodiment, an active doubler (an active multiplier that doubles the frequency of an input signal and outputs the signal) is used. In a conventional multiplier, the power of an output local oscillation signal that has been multiplied varies according to a multiplied frequency. Consequently, as will be described below, in a case where frequency characteristics (S-parameters) of the amplitude and phase of the harmonic mixer 11 are measured and an output signal output from the frequency converter 10 is corrected, the signal level of the local oscillation signal output from the multiplier 15 is unstable and thus it may not be possible to correct the output signal output from the frequency converter 10 with high accuracy and obtain a correct measurement result. Accordingly, in the present embodiment, to make a signal level that has been multiplied constant such that a local oscillation signal with a constant power is output in a predetermined frequency band, an amplification function of automatic gain control (AGC) or a power saturation function is added, and a multiplied local oscillation signal is output to the harmonic mixer 11 with a constant power without changing a signal level at any frequency in a predetermined frequency band.

A power level when the local oscillation signal is supplied to the harmonic mixer 11 is stabilized in a wide frequency band by using the aforementioned multiplier 15 and modulation accuracy and signal level reproducibility in the harmonic mixer 11 are improved. Accordingly, when the frequency characteristics (S-parameters) of the amplitude and phase of the frequency converter 10 are determined in advance and a signal output from the frequency converter 10 is corrected according to the frequency characteristics, the signal level of a local oscillation signal output from the multiplier 15 is constant regardless of the frequency thereof, and thus it is possible to correct the signal output from the frequency converter 10 with high accuracy at any frequency in a predetermined frequency band and to obtain a correct measurement result. Here, the multiplier 15 can arbitrarily change a multiplication number since the multiplication number is changed in combination with the harmonic number of the harmonic mixer 11.

The harmonic mixer 11 has a harmonic number of n=2, receives a modulation signal having a frequency $f_{IF1}$ as an input signal and receives the radio-frequency signal having the frequency $2 \times f_{LO1}$ output from the multiplier 15. The harmonic mixer 11 generates a harmonic signal having a frequency $(2 \times 2 \times f_{LO1} = 4 \times f_{LO1})$ twice the input radio-frequency signal having the frequency $(2 \times f_{LO1})$ therein and mixes the harmonic signal with the input signal having the frequency $f_{IF1}$. The harmonic mixer 11 generates and outputs a radio-frequency signal having a frequency $f_{IF1} + 4 \times f_{LO1}$ by mixing the harmonic signal having the frequency $4 \times f_{LO1}$ with the input signal having the frequency $f_{IF1}$. The output of the harmonic mixer 11 is input to the high pass filter 12. The high pass filter 12 attenuates a low frequency component of the input signal and outputs a resultant signal. The signal output from the high pass filter 12 is amplified in the power amplifier 13 and input to the isolator 14. The isolator 14 is a device that passes a radio-frequency power only in one direction and suppresses input of a reflected wave to the output of the power amplifier 13. In addition, an output signal having a frequency $f_{RF} = f_{IF1} \pm 4 \times f_{LO1}$ is output from the isolator 14. Meanwhile, although both the multiplication number k and the harmonic number n are set to 2 in the example shown in FIG. 2, the present invention is not limited thereto and may set the numbers to any values.

Here, if $f_{RF}$=3 GHz, $f_{LO1}$=14.25 GHz, the multiplication number k=2, and the harmonic number n=2, the frequency $f_{RF}$ of the output signal becomes $f_{RF} = f_{IF1} + k \times n \times f_{LO1} = 3 + 2 \times 2 \times 14.25 = 60$ GHz. In this case, the frequency converter 10 up-converts the frequency $f_{IF1}$=3 GHz of the input signal to the frequency $f_{RF}$=60 GHz.

Meanwhile, the configuration of the frequency converter 10 in a case where the frequency converter is configured as an up-converter is not limited to the configuration shown in FIG. 2 but may be appropriately changed. For example, it may be possible to change the high pass filter 12 to a band pass filter, appropriately add (insert) a low pass filter or a band pass filter to (into) each component, or omit the power amplifier 13 or the isolator 14. In addition, it may be possible to use an attenuator (high frequency attenuator) instead of the isolator 14. Furthermore, it may be possible to reduce the harmonic number n of the harmonic mixer 11 depending on the multiplication number k because the multiplier 15 is installed in the aforementioned configuration. Here, the multiplier 15 may be omitted.

Figure 3:
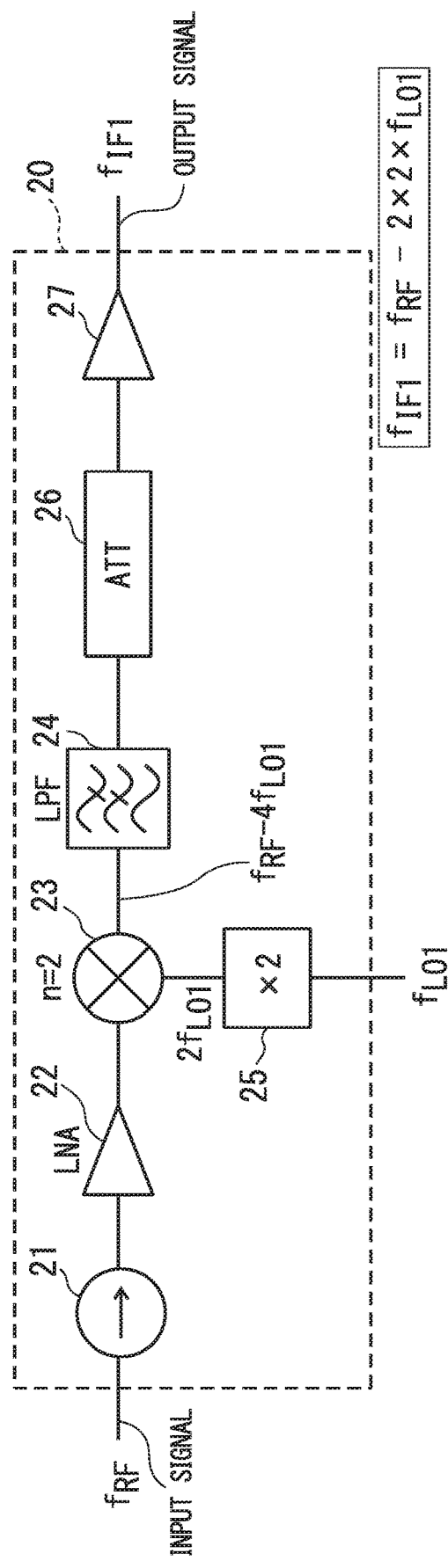
FIG. 3 is a block diagram showing a configuration example of a frequency converter 20 as another embodiment of this disclosure.

Next, a configuration example of the frequency converter 20 will be described with reference to FIG. 3 as an embodiment of this disclosure. The frequency converter 20 shown in FIG. 3 is configured as a down-converter. The frequency converter 20 shown in FIG. 3 includes an isolator 21, a low noise amplifier (LNA) 22, a harmonic mixer 23, a low pass filter 24, a multiplier 25, an attenuator (ATT) 26, and a pre-amplifier 27.

The isolator 21 receives a radio-frequency signal having a frequency $f_{RF}$ as an input signal and inputs the output to the low noise amplifier 22. The isolator 21 suppresses generation of a reflected wave of the input signal. The low noise amplifier 22 amplifies the input signal and outputs the amplified signal to the harmonic mixer 23. The multiplier 25 has a multiplication number k=2, receives a local oscillation signal having a frequency $f_{LO1}$, doubles the frequency to generate a radio-frequency signal having a frequency $2 \times f_{LO1}$, and outputs the radio-frequency signal. The harmonic mixer 23 has a harmonic number n=2, receives a radio-frequency signal having a frequency $f_{RF}$ output from the low noise amplifier 22, and receives the radio-frequency signal having the frequency $2 f \times_{LO1}$ output from the multiplier 25. The harmonic mixer 23 generates a radio-frequency signal having a frequency $(2 \times 2 \times f_{LO1} = 4 \times f_{LO1})$ that is twice the input radio-frequency signal having the frequency $(2 \times f_{LO1})$ therein and mixes the harmonic signal with the input signal having the frequency $f_{RF}$. The harmonic mixer 23 generates and outputs a harmonic signal having a frequency $f_{RF} - 4 \times f_{LO1}$ by mixing the generated harmonic signal having the frequency $4 \times f_{LO1}$ with the input signal having the frequency $f_{RF}$. The output of the harmonic mixer 23 is input to the low pass filter 24. The low pass filter 24 attenuates a high frequency component of the input signal. In this case, the radio-frequency signal (modulation signal) having the frequency $f_{IF1} = f_{RF} - 4 \times f_{LO1}$ is output from the low pass filter 24. Meanwhile, although both the multiplication number k and the harmonic number n are set to 2 in the example shown in FIG. 3, the present invention is not limited thereto and may set the numbers to any values.

Here, if $f_{RF}$=60 GHz, $f_{LO1}$=14.25 GHz, k=2, and n=2, for example, the frequency $f_{IF1} = f_{RF} - k \times n \times f_{LO1} = 60 - 2 \times 2 \times 14.25 = 3$ GHz of the output signal is satisfied. In this case, the frequency converter 20 down-converts the frequency $f_{RF}$=60 GHz of the input signal to the frequency $f_{IF1}$=3 GHz.

Meanwhile, the configuration of the frequency converter 20 in a case where the frequency converter is configured as a down-converter is not limited to the configuration shown in FIG. 3 but may be appropriately changed. For example, it may be possible to change the low pass filter 24 to a band pass filter, appropriately add (insert) a high pass filter or a band pass filter to (into) each component, or omit the low noise amplifier 22 or the isolator 21. In addition, it may be possible to use an attenuator instead of the isolator 21. Furthermore, it may be possible to reduce the harmonic number n of the harmonic mixer 23 depending on the value of the multiplication number k because the multiplier 25 is installed in the aforementioned configuration. Here, the multiplier 25 may be omitted.

The attenuator 26 attenuates the signal level of a signal reflected from an input terminal of the pre-amplifier 27 and suppresses an influence on the output signal at an output terminal of the harmonic mixer 23 due to the signal reflected from the pre-amplifier 27. The attenuator 26 is interposed between the low pass filter 24 and the pre-amplifier 27.

The pre-amplifier 27 amplifies the signal level of the output signal from the low pass filter 24 and outputs the amplified signal to a digital oscilloscope (digital oscilloscope 8 described below) at the subsequent stage. Accordingly, even in a case where the input sensitivity of the digital oscilloscope that measures the output signal from the frequency converter 20 is low, the output signal from the frequency converter 20 can be amplified to any signal level. Therefore, it is possible to appropriately adjust the signal level of the output signal from the frequency converter 20 in accordance with the dynamic range of the digital oscilloscope that measures the output signal.

Furthermore, since the signal level of the output signal output from the frequency converter 20 is adjusted to the sensitivity of the digital oscilloscope 8, in a case where an amplifier is interposed between the frequency converter 20 and the oscilloscope 8, a correct measurement result of the output signal cannot be obtained because the characteristics of the amplifier are unknown. However, when the pre-amplifier 27 that adjusts the signal level of an output signal is installed in advance in the frequency converter 20 as in the present embodiment, the frequency characteristics of the pre-amplifier 27 can also be included in the frequency characteristics of the frequency converter 20, and thus it is possible to easily configure a measuring system capable of measuring an output signal with high accuracy in accordance with the input sensitivity of the digital oscilloscope.

Like the multiplier 15, the multiplier 25 doubles the frequency $f_{LO1}$ of the local oscillation signal, for example, in the present embodiment, and thus an active doubler is used. In a conventional multiplier, the power of an output local oscillation signal that has been multiplied varies according to a multiplied frequency. Consequently, as will be described below, in a case where frequency characteristics (S-parameters) of the amplitude and phase of the frequency converter 20 are measured and an output signal output from the frequency converter 20 is corrected, the signal level of the local oscillation signal output from the multiplier 15 is unstable and thus it may not be possible to correct the output signal output from the frequency converter 20 with high accuracy and obtain a correct measurement result. Accordingly, in the present embodiment, to make a signal level that has been multiplied constant such that a local oscillation signal with a constant power is output in a predetermined frequency band, an amplification function of automatic gain control (AGC) is added to an output unit, and a multiplied local oscillation signal is output to the harmonic mixer 23 with a constant power without changing the signal level at any frequency in a predetermined frequency band.

A power level when the local oscillation signal is supplied to the harmonic mixer 23 is stabilized in a wide frequency band by using the aforementioned multiplier 25 so that both of a modulation accuracy and signal level reproducibility in the harmonic mixer 23 are improved. Accordingly, when the frequency characteristics (S-parameters) of the amplitude and phase of the frequency converter 20 are determined in advance in order that a signal output from the frequency converter 20 is corrected according to the frequency characteristics, the signal level of a local oscillation signal output from the multiplier 25 is constant regardless of the frequency thereof, and thus it is possible to correct the signal output from the frequency converter 20 with high accuracy at any frequency in a predetermined frequency band and to obtain a correct measurement result. Here, the multiplier 25 can arbitrarily change a multiplication number since the multiplication number is changed in combination with the harmonic number of the harmonic mixer 23.

In addition, the harmonic number n of the each of the harmonic mixers 100, 11 and 23 shown in FIGS. 1 to 3 is not limited to 4 but may be 2, 6 or the like. Further, the value n is not limited to even numbers but may be an odd number. Each of the harmonic mixers 100, 11 and 23 may be configured such that the value of the harmonic number n is arbitrarily changed in combination with the multiplication number of the multiplier 15.

That is, there are cases in which spurious is generated depending on the type of a used harmonic mixer according to the harmonic number n due to a frequency, a frequency bandwidth, and the like on which frequency conversion is performed, which is caused by the circuit characteristics of the harmonic mixer, or the like. Accordingly, it is necessary to set the harmonic number of the harmonic mixer as a favorable value in accordance with the characteristics of the used harmonic mixer and also taking into account a combination with a multiple of the multiplier 15, as a result of measurement, experiments and the like corresponding to the frequency and frequency band.

Figure 4:
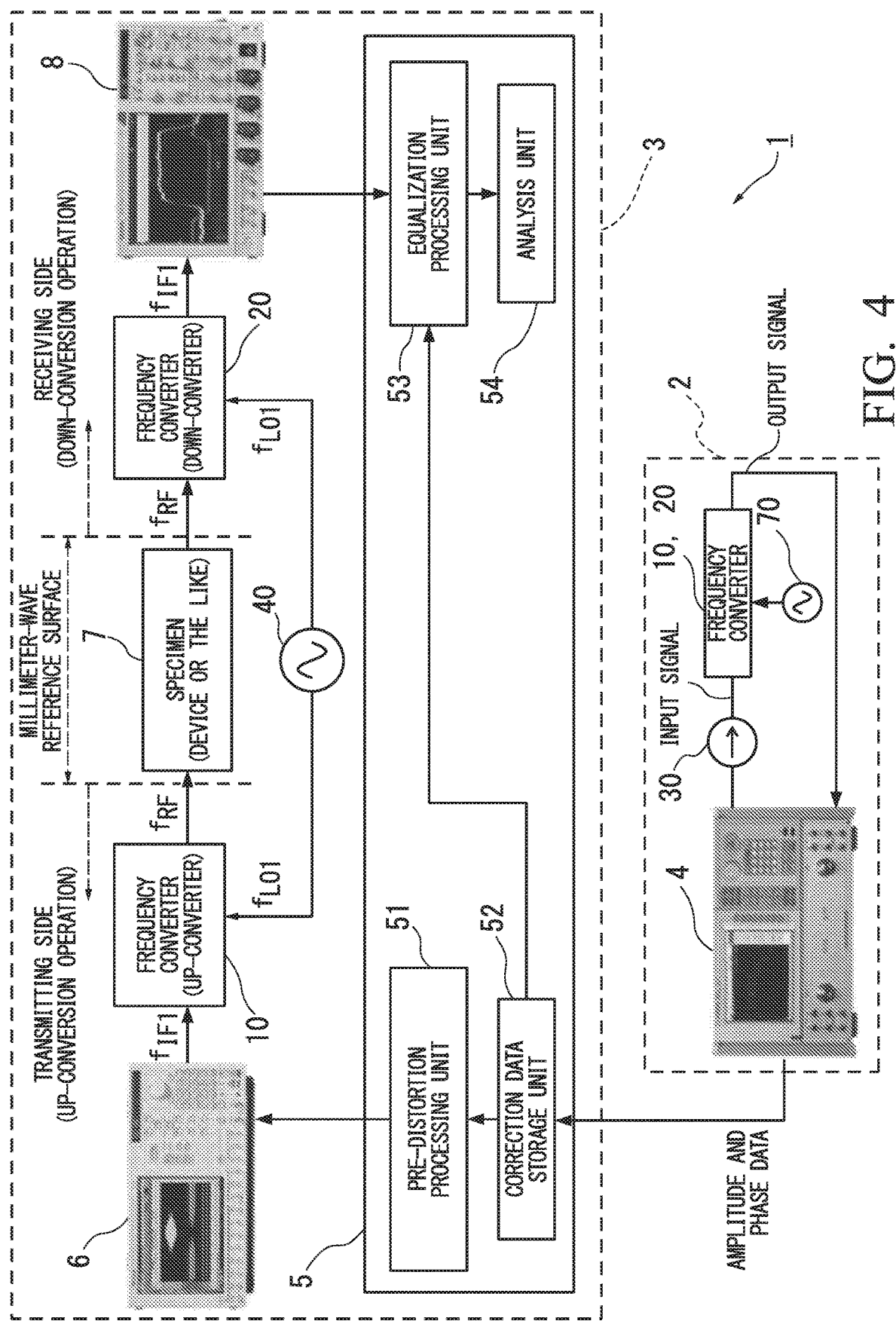
FIG. 4 is a system diagram showing a configuration example of a measuring system 1 as an embodiment of this disclosure.

Next, the measuring system 1 will be described with reference to FIG. 4 as an embodiment of this disclosure. FIG. 4 is a system diagram showing a configuration example of the measuring system 1 as an embodiment of this disclosure. Meanwhile, in FIG. 4, the same components as those shown in FIGS. 2 and 3 are denoted by the same reference signs. The measuring system 1 shown in FIG. 4 includes a correction data acquisition unit 2 and a measuring unit 3.

The measuring unit 3 includes a control unit 5, an arbitrary signal generator 6, a frequency converter 10, a frequency converter 20, a digital oscilloscope 8, and a local oscillator 40. In addition, a specimen 7, which is a measurement target sample, such as a radio-frequency device, is inserted between the frequency converter 10 and the frequency converter 20 when measurement is performed. For example, the specimen 7 is a device such as an antenna or a low noise amplifier. Among the components, at least the arbitrary signal generator 6 and the digital oscilloscope 8 are calibrated measuring devices on the market.

For example, the control unit 5 is configured using a computer such as a personal computer. The control unit 5 includes a pre-distortion processing unit 51, a correction data storage unit 52, an equalization processing unit 53, and an analysis unit 54. Here, the pre-distortion processing unit 51, the equalization processing unit 53 and the analysis unit 54 are configured as software executed on the computer configuring the control unit 5 using hardware resources of the computer. In addition, the correction data storage unit 52 is configured as a predetermined storage region in a storage device included in the control unit 5.

The correction data storage unit 52 stores data indicating frequency characteristics (i.e., 2-port S-parameters S21 indicating transfer characteristics) of variations in amplitudes and phases between input/output signals of the frequency converter 10 and the frequency converter 20, obtained in the correction data acquisition unit 2. Here, it may be possible to record data indicating how to correct waveforms instead of or in addition to recording of the frequency characteristics, for example.

The pre-distortion processing unit 51 performs a process for correcting a signal waveform generated by the arbitrary signal generator 6 on the basis of the data indicating the frequency characteristics of the amplitudes and phases of the frequency converter 10 and the frequency converter 20, which is stored in the correction data storage unit 52. For example, the pre-distortion processing unit 51 changes an amplitude value and a phase value of the waveform generated by the arbitrary signal generator 6 in response to a frequency on the basis of the data indicating the frequency characteristics of the amplitude and the phase of the frequency converter 10, which is an up-converter such that amplitude characteristic variations and phase characteristic variations due to the frequency converter 10 are canceled (i.e., such that frequency characteristics become flat). For example, when an amplitude of an output signal of the frequency converter 10 is attenuated to a greater degree in a certain frequency band than in other frequency bands, the pre-distortion processing unit 51 performs a correction of amplifying the amplitude value in the frequency band such that the attenuation is eliminated. In addition, when the phase of the output signal of the frequency converter 10 is delayed by a greater amount in a certain frequency band than in other frequency bands, the pre-distortion processing unit 51 performs a correction of advancing the phase in the frequency band to eliminate the delay.

The equalization processing unit 53 performs a correction process on measurement data measured and recorded by the digital oscilloscope 8 on the basis of the data indicating the frequency characteristics of the amplitudes and the phases of the frequency converter 10 and the frequency converter 20, which is stored in the correction data storage unit 52. For example, the equalization processing unit 53 changes an amplitude value and a phase value of the measurement data in response to a frequency on the basis of the data indicating the frequency characteristics of the amplitude and the phase of the frequency converter 20, which is a down-converter such that amplitude characteristic variations and phase characteristic variations due to the frequency converter 20 are eliminated (i.e., such that frequency characteristics become flat). For example, when the amplitude of an output signal of the frequency converter 20 is attenuated to a greater degree in a certain frequency band than in other frequency bands, the equalization processing unit 53 performs a correction of amplifying the amplitude value in the frequency band such that the attenuation is eliminated. In addition, when the phase of the output signal of the frequency converter 20 is delayed by a greater amount in a certain frequency band than in other frequency bands, the equalization processing unit 53 performs a correction of advancing the phase in the frequency band to eliminate the delay.

The analysis unit 54 performs a process of analyzing a predetermined radio-frequency characteristic of the specimen 7 on the basis of the measurement data corrected by the equalization processing unit 53.

The arbitrary signal generator 6 generates a waveform having an arbitrary shape on the basis of a predetermined setting manipulation using a manipulator included in the arbitrary signal generator 6 or a control signal input from the control unit 5 and inputs the waveform to the frequency converter 10. In the following description, the arbitrary signal generator 6 outputs a modulation signal having a predetermined bandwidth of an intermediate frequency $f_{IF1}$.

The frequency converter 10 is configured as an up-converter, as shown in FIG. 2, receives a signal having the frequency $f_{IF1}$ output from the arbitrary signal generator 6 as an input signal, and receives a signal having a frequency $f_{LO1}$ output from the local oscillator 40 as a local oscillation signal. In addition, the frequency converter 10 mixes the input signal having the frequency $f_{IF1}$ with a harmonic signal k×n times the local oscillation signal having the frequency $f_{LO1}$ to output a radio-frequency signal having a frequency $f_{RF}$ as an output signal.

The frequency converter 20 is configured as a down-converter, as shown in FIG. 3, receives the signal having the frequency $f_{RF}$ output from the frequency converter 10 as an input signal, for example, via the specimen 7, and receives the signal having the frequency $f_{LO1}$ output from the local oscillator 40 as a local oscillation signal. In addition, the frequency converter 20 mixes the input signal having the frequency $f_{RF}$ with a harmonic signal k×n times the local oscillation signal having the frequency $f_{LO1}$ to output a signal having a frequency $f_{IF1}$ as an output signal.

The digital oscilloscope 8 receives the output signal of the frequency converter 20 at predetermined sampling intervals and records the output signal in a predetermined storage device therein.

The local oscillator 40 generates the local oscillation signal having the frequency $f_{LO1}$, distributes the local oscillation signal, for example, using a distributor (not shown), and inputs the local oscillation signal to the frequency converter 10 and the frequency converter 20.

Meanwhile, the correction data acquisition unit 2 is a component for acquiring the transfer characteristics (i.e., 2-port S-parameters S21 indicating the transfer characteristics) of the frequency converter 10 and the frequency converter 20, described above with reference to FIGS. 2 and 3, in advance prior to measurement of the specimen 7. That is, the correction data acquisition unit 2 measures the frequency characteristics of the amplitudes and the phases of the frequency converter 10 and the frequency converter 20 in advance prior to measurement of the radio-frequency characteristic of the specimen 7 by the measuring unit 3.

In the example shown in FIG. 4, the correction data acquisition unit 2 includes a millimeter-wave vector network analyzer 4. The millimeter-wave vector network analyzer 4 is a measuring device that measures a radio-frequency characteristic of a specimen, such as an S-parameter of a millimeter-wave band and is a calibrated apparatus on the market in this case. In the correction data acquisition unit 2, a circuit composed of an isolator 30, the frequency converter 10 or 20, and a local oscillator 70 is connected to the millimeter-wave vector network analyzer 4. For example, the local oscillator 70 generates a local oscillation signal having the same frequency as the local oscillator 40 and inputs the local oscillation signal to the frequency converter 10 or 20 as a local oscillation signal. Here, the local oscillation signal may be provided by the millimeter-wave vector network analyzer 4. The frequency converter 10 and the frequency converter 20 are alternately connected to the millimeter-wave vector network analyzer 4 so that frequency characteristics of variations in the amplitudes and the phases (i.e., transfer characteristics) between input signals and output signals thereof are measured.

The isolator 30 is inserted between a signal output terminal of the millimeter-wave vector network analyzer 4 and a signal input terminal of the frequency converter 10 or 20. The isolator 30 suppresses a signal, which has been output from the millimeter-wave vector network analyzer 4 and input to the frequency converter 10 or 20, from being reflected to the millimeter-wave vector network analyzer 4. Meanwhile, an attenuator may be used instead of the isolator 30. The applicant confirmed that the effect of waveform correction performed by the pre-distortion processing unit 51 and the equalization processing unit 53 is improved by installing the isolator 30 and the like.

Meanwhile, when the frequency characteristics of the frequency converters 10 and 20 are measured, the frequency sweep range may be set depending on the bandwidths of the radio-frequency signal $f_{RF}$ and the modulation signal input to the specimen 7. For example, if the specimen 7 is a device applied to predetermined wireless communication, the range of frequency sweeping can be set to cover a frequency range determined by the carrier frequency of each channel used in the wireless communication and the bandwidth of a modulation signal of each channel.

A result of measurement using the millimeter-wave vector network analyzer 4, that is, the frequency characteristics (i.e., 2-port S-parameters S21 indicating transfer characteristics) of the amplitudes and the phases of the frequency converter 10 and the frequency converter 20 are read by the control unit 5 via a predetermined recording medium or a predetermined communication line and stored in the correction data storage unit 52.

Figure 5:
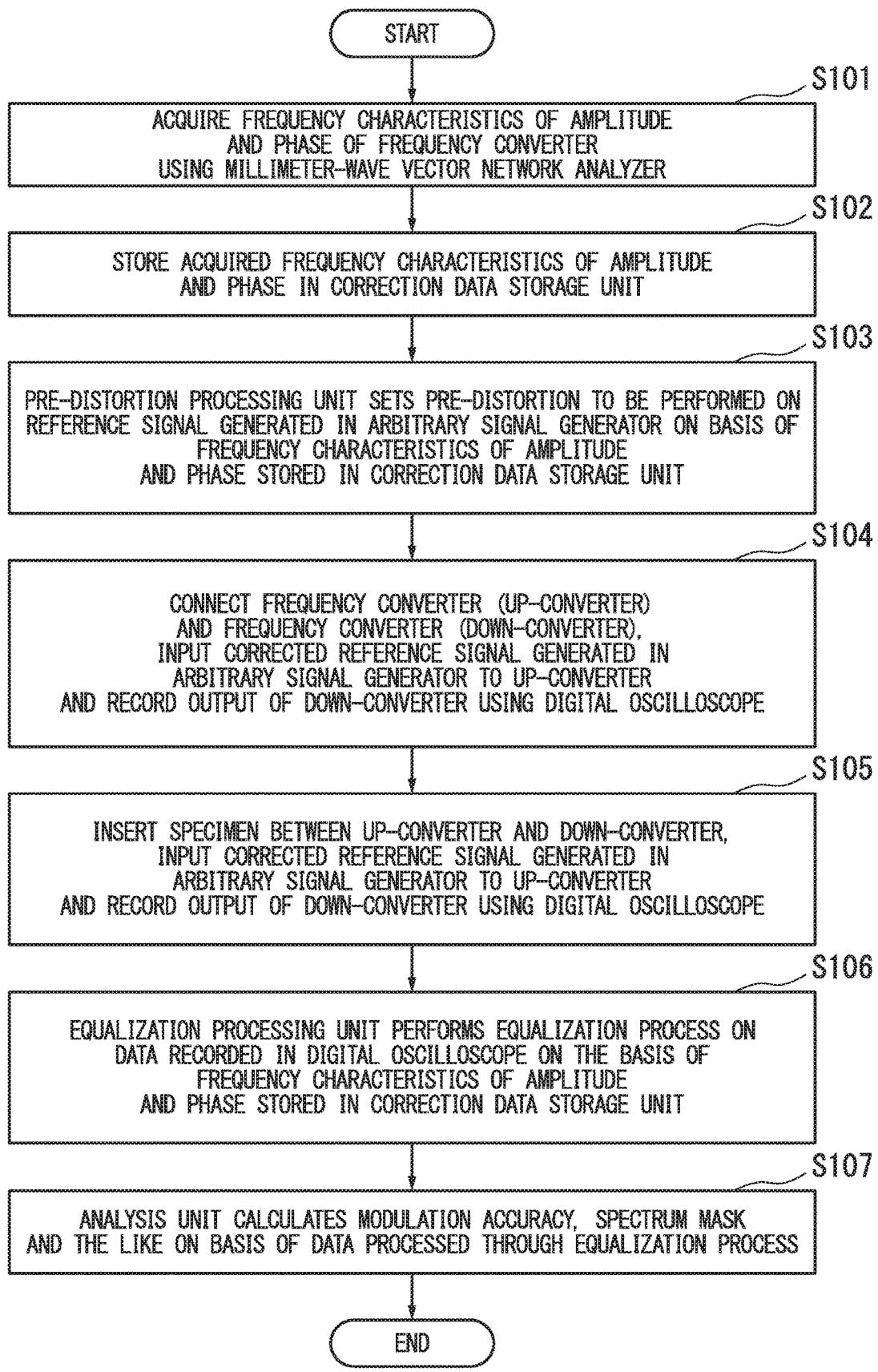
FIG. 5 is a flowchart showing an example of a flow of a measuring process performed by the measuring system 1 of FIG. 4.

Next, a flow of a process performed when the radio-frequency characteristic of the specimen 7 is measured by the measuring system 1 will be described with reference to FIGS. 4 and 5.

First, a user acquires frequency characteristics (S-parameter S21) of the amplitude and the phases of the frequency converters 10 and 20 using the millimeter-wave vector network analyzer 4 (step S101). That is, the S-parameters of the frequency converters 10 and 20 including harmonic mixers are determined in advance using the millimeter-wave vector network analyzer 4. Here, the measurement may be automatically or semi-automatically performed under the control of the control unit 5, for example.

Then, the frequency characteristics (S-parameter S21) of the amplitudes and the phases acquired in step S101 are stored in the correction data storage unit 52 according to a predetermined instruction manipulation performed by the user for the control unit 5 and the like (step S102).

Subsequently, the pre-distortion processing unit 51 sets pre-distortion to be applied to a waveform (regarded as a reference signal) generated in the arbitrary signal generator 6 on the basis of the frequency characteristics (S-parameter S21) of the amplitudes and the phases stored in the correction data storage unit 52 according to a predetermined instruction manipulation performed by the user for the control unit 5 (step S103).

Thereafter, the user connects the frequency converter (up-converter) 10 and the frequency converter (down-converter) 20 directly (i.e., via a shortest wave guide or the like) and performs a predetermined instruction manipulation directly or via the control unit 5 to input a corrected reference signal generated in the arbitrary signal generator 6 to the frequency converter (up-converter) 10 and to measure and record an output of the frequency converter (down-converter) 20 through the digital oscilloscope 8 (step S104). The output terminal (formed as an insertion opening of a wave guide, for example) of the frequency converter (up-converter) 10 and the input terminal (formed as an insertion opening of the wave guide, for example) of the frequency converter (down-converter) 20 become reference surfaces when the radio-frequency characteristic of millimeter-wave bands of the specimen 7 is measured. In addition, the left side of the drawing on the basis of the millimeter-wave reference surfaces is a transmitting side (i.e., up-conversion operation) and the right side of the drawing on the basis of the millimeter-wave reference surfaces is a receiving side (i.e., down-conversion operation).

Next, the user inserts the specimen 7 between the frequency converter (up-converter) 10 and the frequency converter (down-converter) 20 and performs a predetermined instruction manipulation directly or via the control unit 5 to input the corrected reference signal generated in the arbitrary signal generator 6 to the frequency converter (up-converter) 10 and to measure and record an output of the frequency converter (down-converter) 20 through the digital oscilloscope 8 (step S105).

Subsequently, the equalization processing unit 53 performs a correction process (i.e., equalization process) on the data recorded in the digital oscilloscope 8 on the basis of the frequency characteristics (S-parameter S21) of the amplitudes and the phases stored in the correction data storage unit 52 according to a predetermined instruction manipulation performed by the user for the control unit 5 (step S106).

Here, for example, the correction process is performed on both the measurement value recorded in step S104 and the measurement value recorded in step S105.

Then, the analysis unit 4 performs a process of calculating a constellation (modulation accuracy), a spectrum mask, and the like, for example, on the basis of data corrected by the equalization processing unit 53 according to a predetermined instruction manipulation performed by the user for the control unit 5 (step S107). Here, an analysis result of the radio-frequency characteristic of the specimen 7 can be calculated on the basis of variations in values of amplitude and phase variations (or impedances, distortion amounts and various parameters) in the measurement value obtained in step S105 and corrected in step S106 from reference values, which are values of amplitude and phase variations (or impedances, distortion amounts and various parameters) in the measurement value obtained in step S104 and corrected in step S106. That is, the measurement value (or a value obtained by correcting the measurement value) of the specimen 7 measured in step S105 may be analyzed on the basis of the measurement values (or a value obtained by correcting the measurement value) of the millimeter-wave reference surfaces measured in step S104.

Figure 6A:
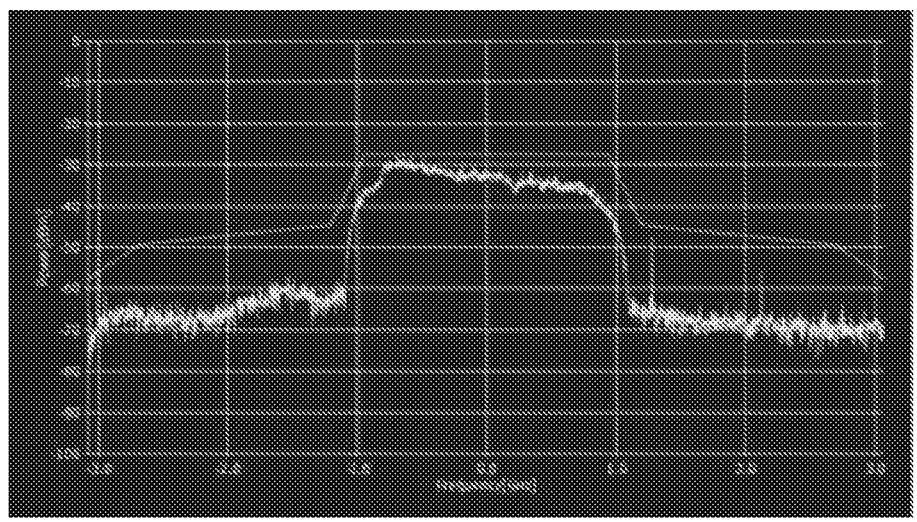
FIG. 6A is a diagram showing an example of a comparison result of the presence or absence of correction in the measuring system 1 of FIG. 4.
Figure 6B:
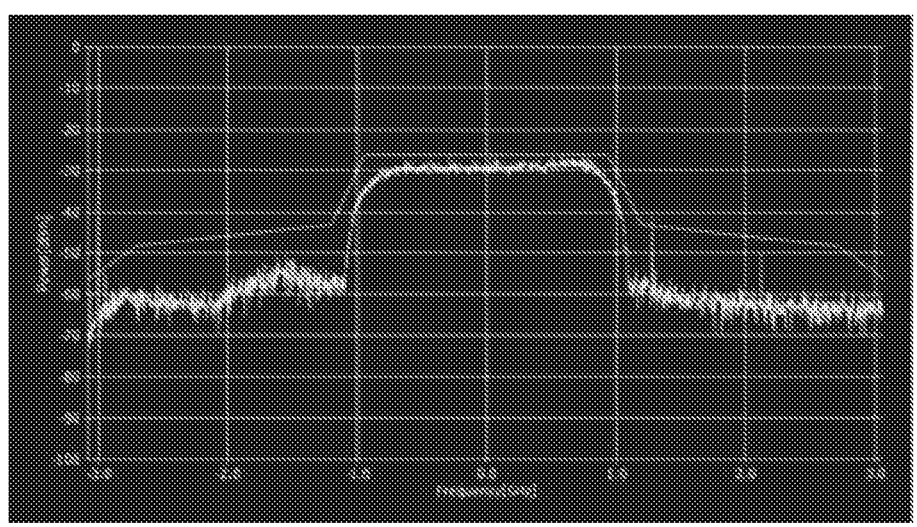
FIG. 6B is a diagram showing an example of a comparison result of the presence or absence of correction in the measuring system 1 of FIG. 4.

Next, with reference to FIGS. 6A to 6D, description will be made to results of confirmation of effects of correction of amplitudes and phases by the pre-distortion processing unit 51 for an input signal to the frequency converter 10 at the transmitting side and effects of correction of amplitudes and phases by the equalization processing unit 53 for an output signal from the frequency converter 20 at the receiving side. FIG. 6A is a result of observation of a spectrum mask in a case where neither the correction by the pre-distortion processing unit 51 nor the correction by the equalization processing unit 53 was performed. On the other hand, FIG. 6B is a result of observation of a spectrum mask in a case where both the correction by the pre-distortion processing unit 51 and the correction by the equalization processing unit 53 were performed. Here, vector correction disclosed in FIGS. 6B and 6D means correction of both the amplitude and the phase.

Figure 6C:
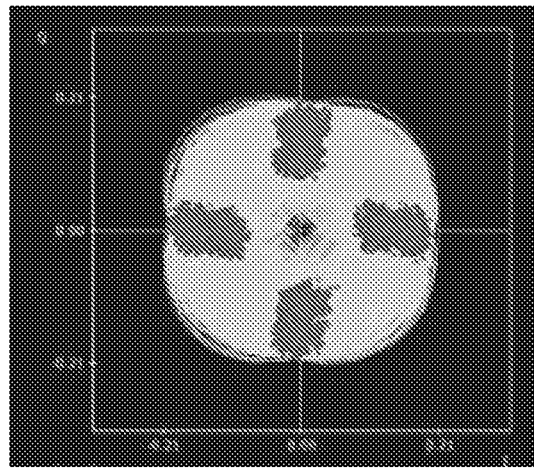
FIG. 6C is a diagram showing an example of a comparison result of the presence or absence of correction in the measuring system 1 of FIG. 4.
Figure 6D:
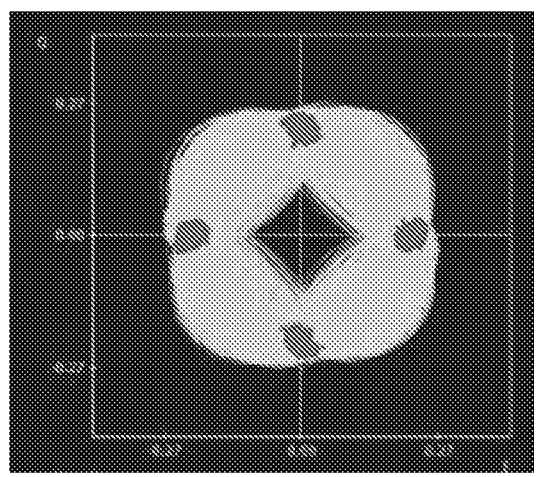
FIG. 6D is a diagram showing an example of a comparison result of the presence or absence of correction in the measuring system 1 of FIG. 4.

Furthermore, FIG. 6C is a constellation in a case where neither the correction by the pre-distortion processing unit 51 nor the correction by the equalization processing unit 53 was performed. On the other hand, FIG. 6D is a constellation in a case where both the correction by the pre-distortion processing unit 51 and the correction by the equalization processing unit 53 were performed. An error vector magnitude (EVM) value was 23.9% in a case where no correction was performed and 8.1% in a case where correction was performed, and thus improvement of modulation accuracy was confirmed.

As described above, in the embodiments of this disclosure, the structure of the frequency converter can be simplified because the frequency converter is configured using the harmonic mixer, and manufacturing costs can be reduced and a measurement setup can be facilitated because a modulation signal is measured using the general-purpose digital oscilloscope. In addition, in a case where the harmonic mixer is used, although an output signal may include many image (false image) signals and these image signals may overlap a desired signal that has been frequency-converted, which may cause deterioration of modulation accuracy and the like, deterioration of the modulation accuracy and the like is prevented by correcting waveforms using measurement values of frequency characteristics of amplitudes and phases. Accordingly, even if a frequency converter has frequency characteristics that are not good as a single body, it is possible to easily improve the characteristics through digital correction. That is, in the present embodiment, the frequency characteristics of the frequency converters 10 and 20 are found in advance through measurement and digital correction is performed on the frequency converters 10 and 20 when they are used. Accordingly, even if a property of a device as a single body is not good, it is possible to perform measurement with high accuracy by performing correction.

Meanwhile, embodiments of this disclosure are not limited to the above-described embodiments. For example, the local oscillator 40 may be integrated into the frequency converter 10 and the frequency converter 20. It is possible to configure the measuring unit 3 more easily by incorporating the local oscillator 40 into the frequency converter 10 and the frequency converter 20. In addition, the frequency converter 10, the frequency converter 20, and the local oscillator 40 may be integrated into the arbitrary signal generator 6 or the digital oscilloscope 8. Furthermore, preliminary measurement of the frequency characteristics of the amplitudes and the phases of the frequency converter 10 and the frequency converter 20 may not necessarily be performed whenever the specimen 7 is measured, but, for example, may be performed at a specific interval. Accordingly, there is no need to prepare the generally expensive millimeter-wave vector network analyzer for measurement at all times. In addition, data of preliminary measurement can also be prepared in a plurality of measurement environments such as room temperature.

Figure 8:
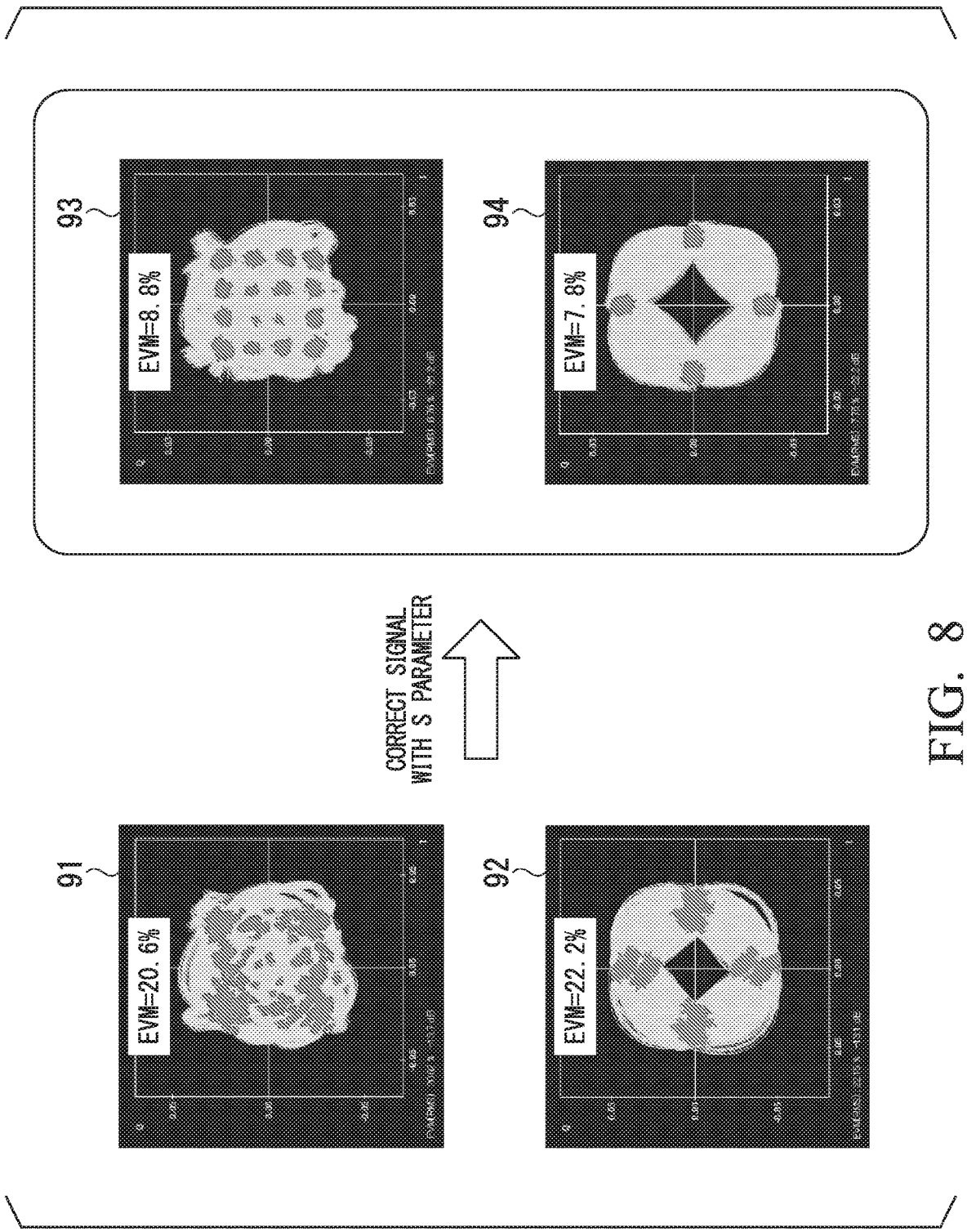
FIG. 8 is a diagram showing another example of a comparison result of the presence or absence of correction in this disclosure.

In addition, FIG. 8 is a diagram showing another example of comparison results of the presence or absence of correction in this disclosure. The example of FIG. 8 shows a comparison in a channel of 60 GHz and uses 16 QAM and a π/2 BPSK signal. In FIG. 8, the comparison results were obtained using a configuration in which the frequency converter (down-converter) 20 of FIG. 4 has a harmonic mixer. Here, the frequency converter (up-converter) 10 in FIG. 4 does not have a harmonic mixer. Meanwhile, a channel used in the comparison results of FIG. 8 is an allocated channel of IEEE 802.11ad.

In FIG. 8, a constellation 91 was obtained when 16 QAM was used and correction was not performed. EVM was 20.6%. With respect to this, signal correction was performed using an S-parameter to obtain a constellation 93. In the constellation 93, EVM was 8.8%, which was a considerable improvement.

In FIG. 8, a constellation 92 was obtained when a π/2 BPSK signal was used and correction was not performed. EVM was 22.2%. With respect to this, signal correction was performed using an S-parameter to obtain a constellation 94. In the constellation 94, EVM was 7.8%, which was a considerable improvement.

As understood from FIG. 8, EVM can be considerably improved even in a configuration in which only the frequency converter (down-converter) 20 of FIG. 4 has a harmonic mixer.

Figure 9:
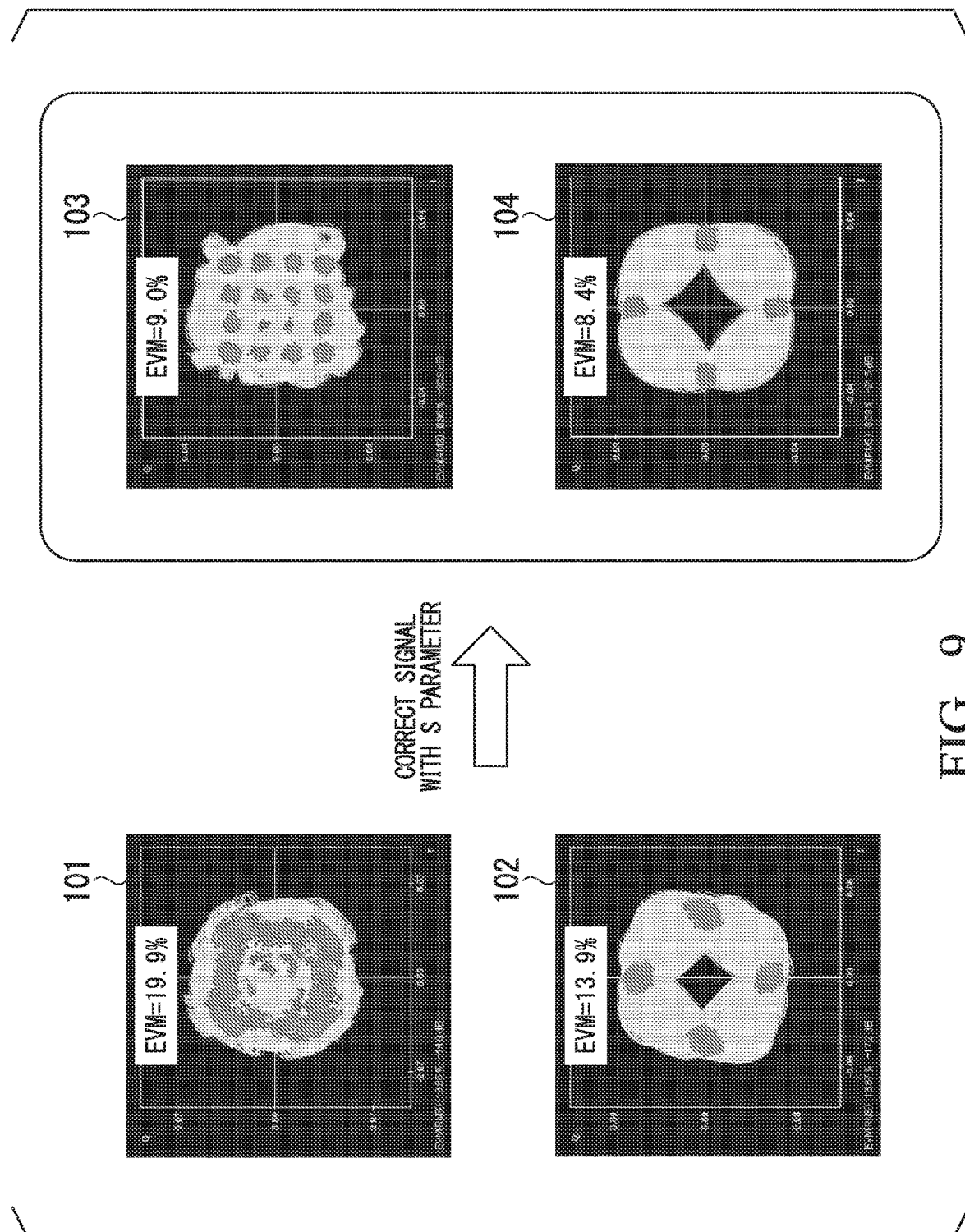
FIG. 9 is a diagram showing still another example of a comparison result of the presence or absence of correction in this disclosure.

FIG. 9 is a diagram showing still another example of comparison results of the presence or absence of correction in this disclosure. The example of FIG. 9 shows a comparison in a channel of 60 GHz, which is different from FIG. 8, and uses 16 QAM and a π/2 BPSK signal. In FIG. 9, the comparison results were obtained using a configuration in which the frequency converter (down-converter) 20 of FIG. 4 has a harmonic mixer. Here, the frequency converter (up-converter) 10 in FIG. 4 has no harmonic mixer. Meanwhile, a channel used in the comparison results of FIG. 9 is an allocated channel of IEEE 802.11ad.

In FIG. 9, a constellation 101 was obtained when 16 QAM was used and correction was not performed. EVM was 19.9%. With respect to this, signal correction was performed using an S-parameter to obtain a constellation 103. In the constellation 103, EVM was 9.0%, which was a considerable improvement.

In FIG. 9, a constellation 102 was obtained when a π/2 BPSK signal was used and correction was not performed. EVM was 13.9%. With respect to this, signal correction was performed using an S-parameter to obtain a constellation 104. In the constellation 104, EVM was 8.4%, which was a considerable improvement.

As understood from FIG. 9, EVM can be considerably improved even in a configuration in which only the frequency converter (down-converter) 20 of FIG. 4 has a harmonic mixer. Although different channels were used in FIGS. 8 and 9, the EVM was considerably improved in both cases.

Furthermore, the this disclosure may have several exemplary embodiments in addition to the above-described embodiments. In a first exemplary embodiment, the frequency converter receives a predetermined input signal and a predetermined local oscillation signal and outputs a signal obtained by mixing the input signal with a harmonic signal having a frequency n times the frequency of the local oscillation signal as an output signal, wherein a circuit that mixes the input signal with the harmonic signal is a harmonic mixer that mixes the harmonic signal with the input signal using a nonlinear characteristic of a semiconductor element, and the input signal or the output signal is subjected, before input to the frequency converter or after output from the frequency converter, to correction on the basis of previously measured frequency characteristics of the amplitude and the phase of the frequency converter.

Further, in a second exemplary embodiment, the frequency converter further includes a multiplier that multiplies the frequency of the local oscillation signal by k times and inputs the resultant signal to the harmonic mixer.

Further, in a third exemplary embodiment, with respect to the frequency converter, the measurement is performed by a vector network analyzer, wherein the vector network analyzer generates and outputs the input signal input to the frequency converter and receives and measures the output signal output from the frequency converter to measure the frequency characteristics of the amplitude and the phase of the frequency converter, and the input signal is input to the frequency converter from the vector network analyzer via an isolator or an attenuator.

Further, in a fourth exemplary embodiment, a measuring system includes: the first frequency converter; the second frequency converter; a signal generator that generates the signal having the corrected waveform and outputs the signal to the first frequency converter; a signal measuring device that measures a signal output from the second frequency converter that has received a signal output from the first frequency converter; and a correction processing unit that performs the correction on the measurement result of the signal measuring device.

Further, in a fifth exemplary embodiment, a measuring method includes inserting a specimen between the first frequency converter and the second frequency converter and measuring a radio-frequency characteristic of the specimen using the first frequency converter, the second frequency converter, a signal generator that generates the corrected modulation signal and outputs the modulation signal to the first frequency converter, a signal measuring device that measures a signal output from the second frequency converter that has received a signal output from the first frequency converter, and a correction processing unit that performs the correction on the measurement result of the signal measurement device.

According to the above-described embodiments, a mixer included in a frequency converter can be constituted of a single harmonic mixer. Accordingly, the configuration can be simplified.

INDUSTRIAL APPLICABILITY

This disclosure relates to a frequency converter, a measuring system and a measuring method.

REFERENCE SIGNS LIST

1 Measurement system
2 Correction data acquisition unit
3 Measuring unit
4 Millimeter-wave vector network analyzer
5 Control unit
6 Arbitrary signal generator
8 Digital oscilloscope
10 Frequency converter
11 Harmonic mixer
20 Frequency converter
23 Harmonic mixer
30 Isolator
40 Local oscillator
51 Pre-distortion processing unit
52 Correction data storage unit
53 Equalization processing unit
54 Analysis unit
91 to 94 Constellation
101 to 104 Constellation

The invention claimed is:

1. A measurement system comprising: first and second frequency converters; a signal generator configured to generate a modulation signal having a corrected waveform responsive to a frequency characteristic of an amplitude and a phase of the first frequency converter previously obtained by measurement and output the signal to the first frequency converter; a signal measurement device configured to measure a signal output from the second frequency converter that has received a signal output from the first frequency converter; and a correction processing unit configured to correct a measurement result of the signal measurement device responsive to a frequency characteristic of an amplitude and a phase of the second frequency converter previously obtained by measurement, wherein each of the first and second frequency converters comprise: an input/output configured to receive an input signal and a local oscillation signal and to output a signal obtained responsive to mixing the input signal with a harmonic signal having a frequency n times a frequency of the local oscillation signal; and a circuit configured to mix the input signal with the harmonic signal, wherein the circuit comprises a harmonic mixer that mixes the harmonic signal with the input signal responsive to a nonlinear characteristic of the harmonic mixer, wherein the second frequency converter further comprises a pre-amplifier configured to amplify the signal output from the circuit of the second frequency converter and output the amplified signal to the correction processing unit, and wherein a specimen is insertable between the first and second frequency converters.

2. A measurement method using first and second frequency converters, the measurement method comprising: correcting a modulation signal responsive to a frequency characteristic of an amplitude and a phase of the first frequency converter previously obtained by measurement to generate a corrected modulation signal; inserting a specimen between the first frequency converter and the second frequency converter; inputting the corrected modulation signal to the first frequency converter; recording as a measurement result, a signal output from the second frequency converter that has received a signal output from the first frequency convert; correcting the measurement result responsive to a frequency characteristic of an amplitude and a phase of the second frequency converter previously obtained by measurement; and measuring a radio-frequency characteristic in ultra-wide band corresponding to millimeter waves of the specimen on a basis of the corrected measurement result, wherein each of the first and second frequency converters comprise:
an input/output configured to receive an input signal and a local oscillation signal and to output a signal obtained responsive to mixing the input signal with a harmonic signal having a frequency n times a frequency of the local oscillation signal; and
a circuit configured to mix the input signal with the harmonic signal, wherein the circuit comprises a harmonic mixer that mixes the harmonic signal with the input signal responsive to a nonlinear characteristic of the harmonic mixer,
wherein the second frequency converter further comprises a pre-amplifier configured to amplify the signal output from the circuit of the second frequency converter and output the amplified signal to the correction processing unit,
wherein the signal output from the first frequency converter is an ultra-wide band signal corresponding to millimeter waves, and
wherein the input signal of the second frequency converter is an ultra-wide band signal corresponding to millimeter waves.

3. The measurement system according to claim 1, wherein: the first frequency converter further comprises a first multiplier configured to multiply the frequency of the local oscillation signal by k times and input a first resultant signal to the harmonic mixer; and the second frequency converter further comprises a second multiplier configured to multiply the frequency of the local oscillation signal by k times and input a second resultant signal to the harmonic mixer.

4. The measurement method according to claim 2, wherein: the first frequency converter further comprises a first multiplier configured to multiply the frequency of the local oscillation signal by k times and input a first resultant signal to the harmonic mixer; and the second frequency converter further includes a second multiplier configured to multiply the frequency of the local oscillation signal by k times and input a second resultant signal to the harmonic mixer.

5. A measurement system comprising: first and second frequency converters; a signal generator configured to generate a modulation signal having a corrected waveform responsive to a frequency characteristic of an amplitude and a phase of the first frequency converter previously obtained by measurement and output the signal to the first frequency converter; a signal measurement device configured to measure a signal output from the second frequency converter that has received a signal output from the first frequency converter; and a correction processing unit configured to correct a measurement result of the signal measurement device responsive to a frequency characteristic of an amplitude and a phase of the second frequency converter previously obtained by measurement, wherein each of the first and second frequency converters comprise: an input/output configured to receive an input signal and a local oscillation signal and to output a signal obtained responsive to mixing the input signal with a harmonic signal having a frequency n times a frequency of the local oscillation signal; and a circuit configured to mix the input signal with the harmonic signal, wherein the circuit comprises a harmonic mixer that mixes the harmonic signal with the input signal responsive to a nonlinear characteristic of the harmonic mixer, wherein the second frequency converter comprise a pre-amplifier configured to amplify the signal output from the circuit of the second frequency converter and output the amplified signal to the correction processing unit, wherein a specimen is insertable between the first and second frequency converters, and wherein the signal measurement device comprises a vector network analyzer configured to: generate and output the input signal and receive and measure the output signal to measure the frequency characteristics of the amplitude and the phase of the first and second frequency converters; and input the input signal to the first and second frequency converters via an isolator or an attenuator.

6. The measurement system according to claim 5, wherein: the first frequency converter further comprises a first multiplier configured to multiply the frequency of the local oscillation signal by k times and input a first resultant signal to the harmonic mixer; and the second frequency converter further comprises a second multiplier configured to multiply the frequency of the local oscillation signal by k times and input a second resultant signal to the harmonic mixer.

7. A measurement method using first and second frequency converters, and a signal measurement device, the measurement method comprising: measuring frequency characteristics of an amplitude and a phase of the first and second frequency converters using the signal measurement device; correcting a modulation signal responsive to the frequency characteristic of the amplitude and the phase of the first frequency converter to generate a corrected modulation signal; inserting a specimen between the first frequency converter and the second frequency converter; inputting the corrected modulation signal to the first frequency converter; recording, as a measurement result, a signal output from the second frequency converter that has received a signal output from the first frequency convert; correcting the measurement result responsive to the frequency characteristic of the amplitude and the phase of the second frequency converter; and measuring a radio-frequency characteristic in ultra-wide band corresponding to millimeter waves of the specimen on a basis of the corrected measurement result, wherein the signal measurement device comprises a vector network analyzer configured to: generate and output an input signal and receive and measure an output signal to measure the frequency characteristics the amplitude the phase of the first and second frequency converters; and input the input signal to the first and second frequency converters via an isolator or an attenuator, wherein each of the first and second frequency converters comprise: an input/output configured to receive an input signal and a local oscillation signal and to output a signal obtained responsive to mixing the input signal with a harmonic signal having a frequency n times a frequency of the local oscillation signal; and a circuit configured to mix the input signal with the harmonic signal, wherein the circuit comprises a harmonic mixer that mixes the harmonic signal with the input signal responsive to a nonlinear characteristic of the harmonic mixer, wherein the second frequency converter further comprises a pre-amplifier configured to amplify the signal output from the circuit of the second frequency converter and output the amplified signal to the correction processing unit, wherein the signal output from the first frequency converter is an ultra-wide band signal corresponding to millimeter waves, and wherein the input signal of the second frequency converter is an ultra-wide band signal corresponding to millimeter waves.

8. The measurement method according to claim 7, wherein: the first frequency converter further comprises a first multiplier configured to multiply the frequency of the local oscillation signal by k times and input a first resultant signal to the harmonic mixer; and the second frequency converter further comprises a second multiplier configured to multiply the frequency of the local oscillation signal by k times and input a second resultant signal to the harmonic mixer.

* * * * *